United States Patent [19]

Onishi

[11] Patent Number: 4,477,736
[45] Date of Patent: Oct. 16, 1984

[54] SEMICONDUCTOR INTEGRATED CIRCUIT DEVICE INCLUDING MEANS FOR REDUCING THE AMOUNT OF POTENTIAL VARIATION ON A REFERENCE VOLTAGE LINE

[75] Inventor: Yoshiaki Onishi, Kokubunji, Japan

[73] Assignee: Hitachi, Ltd., Tokyo, Japan

[21] Appl. No.: 315,056

[22] Filed: Oct. 26, 1981

[30] Foreign Application Priority Data

Nov. 7, 1980 [JP] Japan .................. 55-155946

[51] Int. Cl.³ ............................................. H03K 3/013
[52] U.S. Cl. ................................. 307/297; 307/200 B; 307/443; 307/543; 357/23
[58] Field of Search .............. 307/200 A, 200 B, 442, 307/443, 542, 543, 297, 491; 328/263; 357/23 C; 179/77; 381/94

[56] References Cited

U.S. PATENT DOCUMENTS

| | | | |
|---|---|---|---|
| 3,200,260 | 8/1965 | Fisk et al. | 307/200 A X |
| 3,959,665 | 5/1976 | Gilbreath et al. | 307/475 |
| 4,095,163 | 6/1978 | Montague | 307/542 X |

Primary Examiner—Stanley D. Miller
Assistant Examiner—David R. Hudspeth
Attorney, Agent, or Firm—Antonelli, Terry & Wands

[57] ABSTRACT

In an MOS memory, a reference voltage is generated to determine an input threshold voltage of the input circuit. Noise fed from various signal wirings to the reference voltage wiring via stray capacitances is reduced by a decoupling capacitance formed between the reference voltage wiring and the ground wiring. The decoupling capacitance, however, permits relatively large levels of noise induced on the ground wiring by changes in the operation current of the circuit to be transmitted to the reference voltage wiring. According to this invention, a capacitance which forms a pair with the decoupling capacitance is provided between the power-supply wiring and the reference voltage wiring. Noise induced on the power-supply wiring by a change in the operation current of the circuit is substantially opposite in polarity to the noise induced on the ground wiring. Therefore, the noise fed from the ground wiring to the reference voltage wiring is cancelled by the capacitance provided between the power-supply wiring and the reference voltage wiring.

14 Claims, 14 Drawing Figures

SEMICONDUCTOR INTEGRATED CIRCUIT DEVICE INCLUDING MEANS FOR REDUCING THE AMOUNT OF POTENTIAL VARIATION ON A REFERENCE VOLTAGE LINE

BACKGROUND OF THE INVENTION

The present invention relates to a semiconductor integrated circuit device, and particularly to a semiconductor integrated circuit made up of insulated gate-type field effect transistors (hereinafter referred to as MOSFET's) including a differential circuit type input circuit.

In a semiconductor integrated circuit device (hereinafter referred to as IC) with a differential input type digital signal input circuit, the level of a signal introduced from an external unit is compared with a reference potential or a reference voltage by the input circuit. The input threshold voltage of the input circuit of this type is determined not by the threshold voltage of the MOSFET but by the reference voltage. Therefore, the input circuit has an advantage in that the input threshold voltage can be suitably set.

In order to reduce the number of external terminals of the IC, the reference voltage should be produced within the IC.

To produce the reference voltage, a reference voltage generating circuit consisting of a voltage dividing circuit can be formed in the IC.

In this case, however, attention should be paid to the fact that undesirable variations are imparted to the reference voltage. For instance, variations in the power-supply voltage supplied to the reference voltage-generating circuit caused by the voltage variations developing in the power-supply wiring in the IC cannot be neglected. The reference voltage is changed by such variations in the power-supply voltage. Further, there exist undesired electric couplings between the wiring (reference voltage wiring) the reference voltage is applied to and the signal wirings in the IC that a variety of signals are applied to. Hence, the reference voltage wiring receives noise through these electric couplings.

The input threshold voltage of the input circuit undergoes changes due to the change in the reference voltage supplied to the input circuit. Consequently, the input circuit often operates erroneously even when the signals from the external unit are introduced at a suitable level.

In order to reduce the change in the reference voltage, it can be contrived to connect a capacitor between the reference voltage wiring and the grounded power-supply wiring (ground wiring) of the circuit in the IC in order to absorb changes in the voltage.

It was, however, found that the resistance or inductance of the ground wiring in the IC cannot be neglected, and that the change in the operation current in the IC causes changes in the voltage of the ground wiring to a degree that cannot be neglected. Therefore, even if the capacitor is connected to absorb variations in the voltage as mentioned above, it cannot sufficiently prevent undesirable operation of the input circuit.

SUMMARY OF THE INVENTION

An object of the present invention, therefore, is to provide an IC which induces only small variations in the potentials that will be supplied to a reference voltage wiring from a power-supply wiring and a ground wiring.

Another object of the present invention is to provide an IC in which reduced amounts of variations in the potential are given to the reference voltage wiring from the signal lines or semiconductor substrate.

A further object of the present invention is to provide an IC which includes means that work to compensate for variations of the reference voltage, and is of a size suited for being fitted to the IC's.

A still further object of the present invention is to provide an IC which does not require a semiconductor substrate of increased area.

A yet further object of the present invention is to provide an IC in which the wirings are suitably laid out.

Further objects of the present invention will become obvious from the following description taken in conjunction with the accompanying drawings.

DESCRIPTION OF THE PREFERRED EMBODIMENTS

Although not specifically limited, the present invention is adapted to a random access memory RAM made up of MOSFET's.

Figure 1:
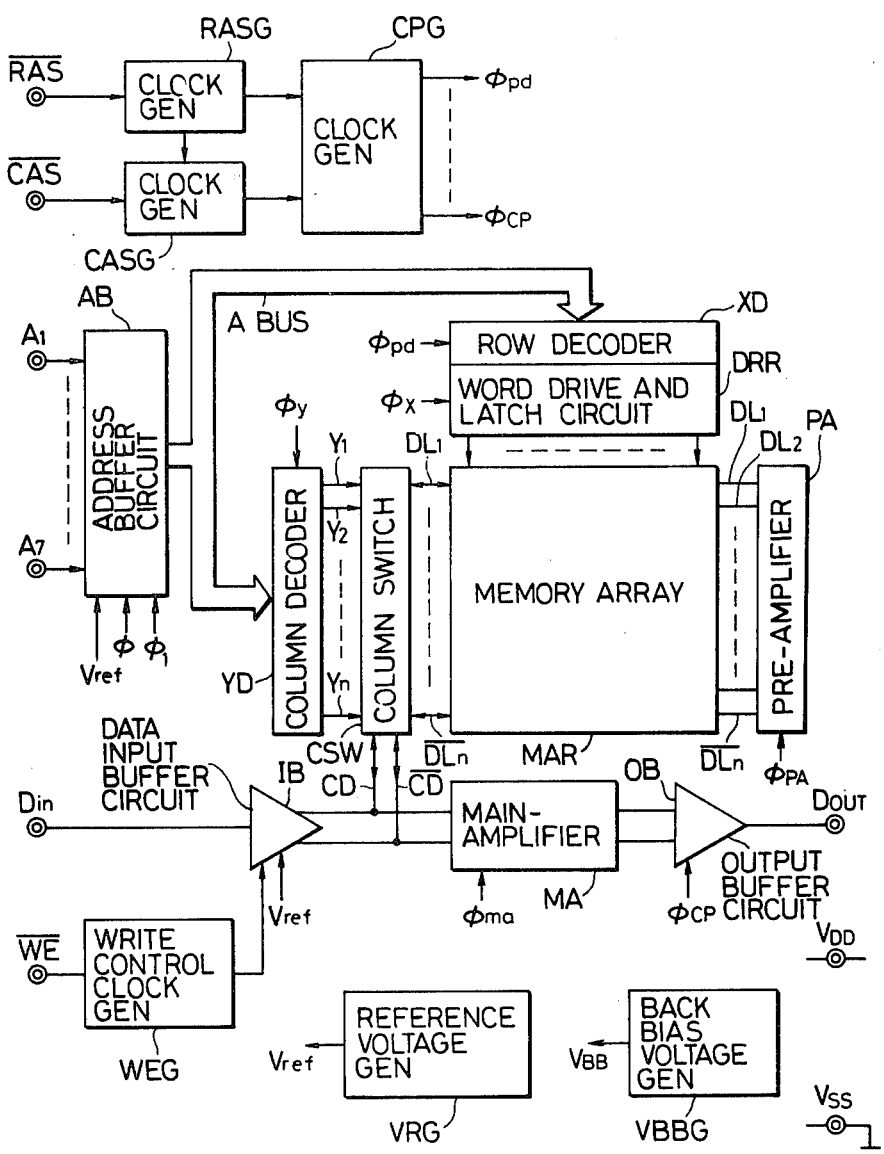
FIG. 1 is a block diagram of a dynamic random access memory.

FIG. 1 is a block diagram of an address multi-system RAM, in which the individual circuit blocks are constructed on one semiconductor substrate according to the conventional MOSIC technique. Terminals $\overline{RAS}$, $\overline{CAS}$, $A_1$ to $A_7$ $D_{in}$, $\overline{WE}$, $D_{OUT}$, $V_{DD}$ and $V_{SS}$ serve as external terminals. The individual circuits in FIG. 1 operate on a power supply voltage from a power supply not shown via the power supply terminal $V_{DD}$ and the ground terminal $V_{SS}$.

In FIG. 1, RASG denotes a clock generator which generates RAS system clock signals according to row address strobe signals ($\overline{RAS}$ signals) that are supplied to the external terminal $\overline{RAS}$, and CASG denotes a clock generator circuit which produces clock signals according to column address stroke signals ($\overline{CAS}$ signals) that are supplied to the external terminal $\overline{CAS}$.

CPG denotes a clock generator circuit which, according to output signals of RASG and CASG, produces clock pulses for controlling the operation of the circuits as will be described later.

AB denotes an address buffer circuit which receives address signals through the external terminals $A_1$ to $A_7$. The operation of the address buffer circuit AB is controlled by the clock signals produced by the clock generator CPG, and discriminates the levels of address signals fed to the external terminals $A_1$ to $A_7$ based upon a reference voltage $V_{ref}$ produced by a reference voltage generator VRG. The output of the address buffer circuit AB is supplied to a row decoder XD and to a column decoder YD via an address bus line ABUS.

DRR denotes a word drive and latch circuit which receives the output of the row decoder XD.

CSW denotes a column switch.

MAR denotes a memory array, and PA denotes a preamplifier which amplifies a differential voltage between a pair of data lines in the memory array MAR.

Figure 2:
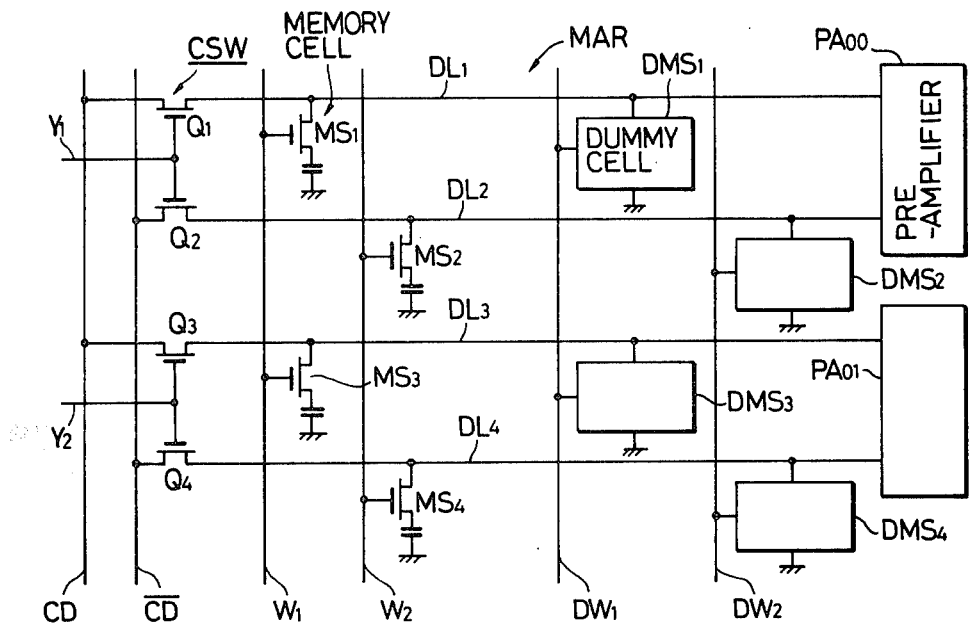
FIG. 2 is a circuit diagram of a memory array.

FIG. 2 illustrates a concrete example of a circuit of the memory array MAR. The memory array MAR consists of a plurality of memory cells $MS_1$ to $MS_4$ that are each composed of 1 MOS transistor/cell and are arrayed in the form of a matrix, dummy cells $DMS_1$ to $DMS_4$, word lines $W_1$ and $W_2$, dummy word lines $DW_1$ and $DW_2$, and data lines $DL_1$, $DL_2$, $DL_3$ and $DL_4$.

In FIG. 1, IB denotes a data input buffer circuit, MA denotes a main amplifier, and OB denotes an output buffer circuit.

WEG denotes a write control clock generator.

VRG denotes a reference voltage generator which produces a reference voltage $V_{ref}$ when a positive power-supply voltage, such as +5 volts, is applied to external terminal $V_{DD}$, and VBBG denotes a back bias voltage generator which produces a negative bias voltage that will be fed to the semiconductor substrate, upon receipt of the power-supply voltage supplied to the external terminal $V_{DD}$.

When the $\overline{RAS}$ signals are fed to the external terminal $\overline{RAS}$ in the address multi system RAM, a variety of RAS type clock signals are correspondingly produced by the clock generator CPG. As the RAS type clock signals are produced, row address signals supplied to external terminals $A_1$ to $A_7$ are set to the address buffer circuit AB. The address signals produced by the address buffer circuit AB are converted into word line selection signals through the row decoder XD, and are set to the word drive and latch circuit DRR. Memory cells arrayed on a row of the memory array MAR are selected by the word line selection signals that have been set to the circuit DRR. As a result, the data of the selected memory cells are read on the data lines of the memory array MAR. The data read on the data lines is amplified by the pre-amplifier PA.

Similarly, as the $\overline{CAS}$ signals are input to the external terminal $\overline{CAS}$, column address signals supplied to the external terminals $A_1$ to $A_7$ are set to the address buffer circuit AB. The address signals set to the address buffer circuit AB are converted into column switch selection signals by the column decoder YD. Therefore, a pair of data lines that are to be selected in the memory array MAR are coupled to a pair of common data lines CD, $\overline{CD}$ via the column switch CSW. The data signals read out from the memory cells that are coupled to the common data lines CD, $\overline{CD}$ via the data lines and column switch CSW, are output to the external terminal $D_{OUT}$ via the main amplifier MA and the output buffer circuit OB.

If the write control signals $\overline{WE}$ supplied to the external terminal $\overline{WE}$ are low level, the data input buffer circuit IB is made operative by the output of the write control clock generator WEG. Accordingly, the data supplied to the external terminal $D_{in}$ are written on the memory cells selected by the circuit DRR via the data input buffer circuit IB, common data lines CD, $\overline{CD}$, column switch CSW, and data lines.

The address buffer circuit AB shown in FIG. 1 is constructed to discriminate the levels of address signals supplied to the external terminals $A_1$ to $A_7$ in comparison with the reference voltage $V_{ref}$ produced by the reference voltage generator VRG. Similarly, although there is no particular limitation, the data input buffer circuit IB has been constructed to discriminate the levels of data signals fed to the external terminal $D_{in}$ in comparison with the reference voltage $V_{ref}$.

Figure 4:
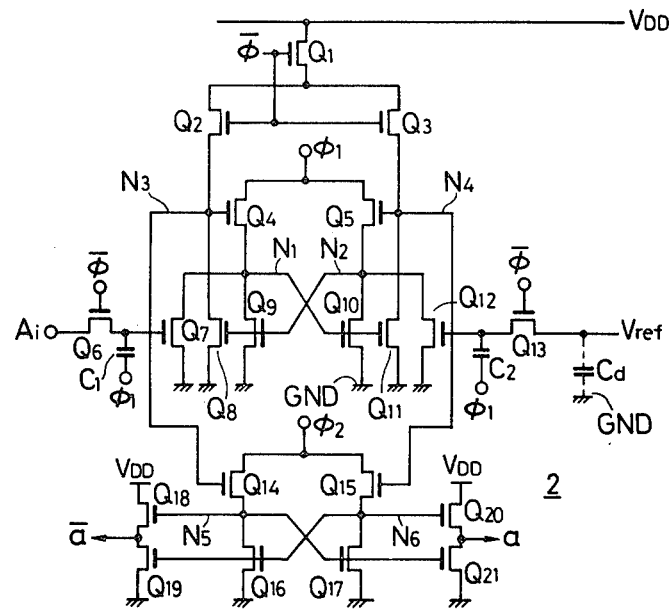
FIG. 4 is a circuit diagram of an address buffer circuit.

FIG. 4 is a diagram illustrating a concrete circuit for the address buffer circuit which equalizes the input threshold voltage to the reference voltage $V_{ref}$.

Figure 5:
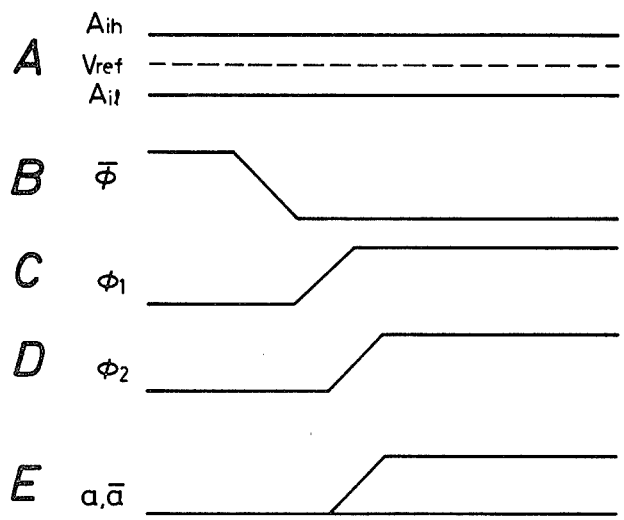
FIG. 5 is a diagram showing the operation waveforms of the circuit of FIG. 4.

The address buffer circuit consists of a plurality of MOSFET's and its operation is controlled by the clock signals $\overline{\phi}$, $\phi_1$ and $\phi_2$ produced by the clock generator CPG, as shown in FIG. 1. When a signal supplied to the external terminal $\overline{RAS}$ or $\overline{CAS}$ of FIG. 1 assumes a low level such as nearly zero volts, the clock signal $\overline{\phi}$ is converted from a high level, i.e. from the level of power-supply voltage $V_{DD}$, into a low level as shown in FIG. 5B. As shown in FIGS. 5C and 5D, the clock signals $\phi_1$ and $\phi_2$ switch from low level to high level a predetermined interval behind the break of the clock signal $\overline{\phi}$.

An address signal is applied to the input electrode of a MOSFET $Q_6$ via an external terminal, and the reference voltage $V_{ref}$ is fed to the input electrode of MOSFET $Q_{13}$. As indicated by the broken line in FIG. 5A, the reference voltage $V_{ref}$ assumes a level between the high level $A_{ih}$ and the low level $A_{il}$ of the address signal which is supplied to the external terminal.

The address buffer circuit shown in FIG. 4 operates as described below.

When the clock signal $\overline{\phi}$ is high level, the MOSFET's $Q_1$ to $Q_3$, and $Q_6$ and $Q_{13}$ are made conductive. With the MOSFET's $Q_1$ to $Q_3$ conductive, nodes $N_3$ and $N_4$ are precharged to nearly the level of the power-supply voltage $V_{DD}$. As the MOSFET's $Q_6$ and $Q_{13}$ are rendered conductive, an address signal $A_i$ and the reference voltage $V_{ref}$ are applied to the gates of MOSFET's $Q_7$ and $Q_{12}$. Since there is a difference between the address signal $A_i$ and the reference voltage $V_{ref}$, the MOSFET's $Q_7$ and $Q_{12}$ assume different conductances. Therefore, when the clock signal $\phi_1$ assumes the high level as shown in FIG. 5C, a signal of the level corresponding to the difference between the address signal $A_i$ and the reference voltage $V_{ref}$ is output to the nodes $N_1$ and $N_2$. Capacitors $C_1$ and $C_2$ are bootstrap capacitors. Due to the presence of the capacitors $C_1$ and $C_2$, the conductances of the MOSFET's $Q_7$ and $Q_{12}$ are increased when the clock signal $\phi_1$ assumes the high level. Consequently, the rate of change of the signal output to the nodes $N_1$ and $N_2$ is increased.

As the clock signal $\phi_1$ assumes the high level, the nodes $N_3$ and $N_4$ which had been precharged to the high level, then assume either the high level or the low level depending upon the level of the address signal $A_i$.

As the clock signal $\phi_2$ assumes the high level as shown in FIG. 5D, the nodes $N_5$ and $N_6$ assume levels that correspond to the levels of the nodes $N_3$ and $N_4$. Consequently, a complementary address signal corresponding to the address signal fed to the gate of the MOSFET $Q_7$ is produced to output nodes a, $\bar{a}$.

With the input circuit shown in FIG. 4 in which the input threshold voltage is determined by the reference voltage, an erroneous operation takes place easily if the reference voltage undergoes variations caused by noise or the like. For example, if the reference voltage is decreased very much, the difference between the reference voltage and the low level $A_{il}$ of the address signal is greatly reduced. Further, if the reference voltage is increased very much, the difference between the reference voltage and the high level of the address signal is reduced. Thus, as the difference in the level is reduced, the difference in conductance between the MOSFET $Q_7$ and the MOSFET $Q_{12}$ is reduced. Consequently, the input circuit tends to operate erroneously.

The reference voltage wiring which spans the semiconductor substrate is undesirably coupled via stray capacitance to the signal wirings which various signals are applied to. Therefore, noise is introduced into the reference voltage wiring. The noise which is introduced into the reference voltage wiring via the stray capacitance can be reduced by connecting a decoupling capacitor having relatively large capacitance between the reference voltage wiring and the ground wiring of the circuit.

In the IC, however, the potential of not only the power-supply wiring but also of the ground wiring is affected by changes in the operation current of the circuit. When the decoupling capacitance is provided, therefore, the coupling between the ground wiring and the reference voltage wiring is reinforced, and the noise produced on the ground wiring is not effectively attenuated but is fed to the reference voltage wiring.

The level of noise produced on the power-supply wiring and the ground wiring in the IC is affected by the circuit setup.

Figure 3:
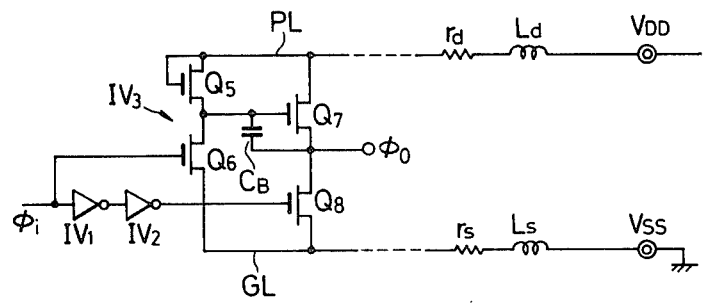
FIG. 3 is a circuit diagram of a bootstrap circuit.

For example, a dynamic MOS memory is provided with a clock generator which includes a bootstrap capacitor $C_B$ as shown in FIG. 3 in order to maximize the level of the clock signals to be generated and to sufficiently drive relatively heavy loads even though the output MOSFET is a limited size. The clock generator of this type, however, generates relatively large noise in the power supply wiring and in the ground wiring.

Namely, in the circuit shown in FIG. 3, the input clock signal $\phi_i$ is applied on one hand to an inverter $IV_3$ consisting of a load MOSFET $Q_5$ and a drive MOSFET $Q_6$, and on the other hand to an output MOSFET $Q_8$ via inverters $IV_1$ and $IV_2$ which serve as delay means. Therefore, the bootstrap capacitor $C_B$ is charged when the output clock signal $\phi_0$ switches from the low level of ground potential to the high level of power-supply voltage $V_{DD}$. When the bootstrap capacitor $C_B$ is charged, however, the load MOSFET $Q_7$ is rendered conductive by the high-level output of the inverter $IV_3$. Therefore, the MOSFET's $Q_7$ and $Q_8$ connected in series are simultaneously rendered conductive during a period of from when the output of the inverter $IV_3$ assumes the high level to when the output of the inverter $IV_2$ assumes the low level. Consequently, a current flows through the MOSFET's $Q_7$ and $Q_8$.

The MOSFET's $Q_7$ and $Q_8$ constitute an output stage which is constructed relatively large to sufficiently drive a load (not diagrammed). Accordingly, a relatively large current passes through.

Resistance $r_d$ and inductance $L_d$ are present in the power-supply wiring PL and cannot be neglected. Therefore, the flow of current through the power-supply wiring PL causes a relatively large level of noise.

Similarly, resistance $r_s$ and inductance $L_s$ that cannot be neglected are also present in the ground wiring GL. Hence, a relatively large level of noise is also induced on the ground wiring GL.

According to the present invention, the noise fed to the reference voltage line from the power-supply wiring and from the ground wiring is restrained by utilizing the relation that the noise induced by the current through the power-supply wiring PL is opposite in phase to the noise induced by the current through the ground wiring GL.

Figure 6:
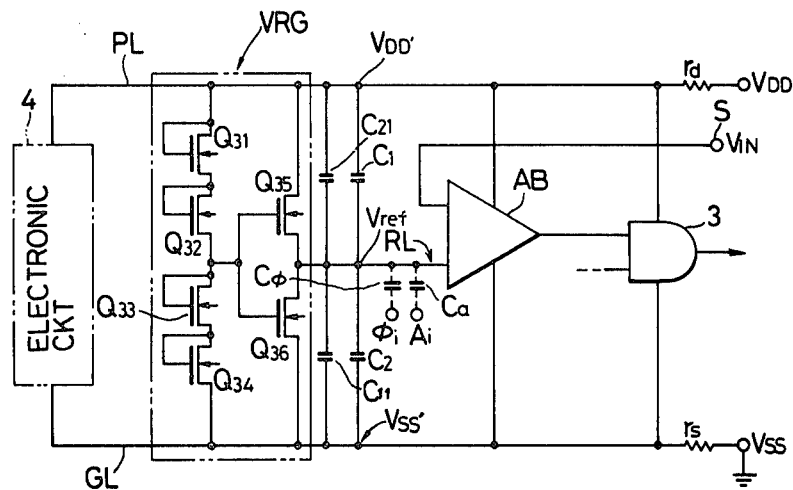
FIG. 6 is a circuit diagram of an embodiment of the present invention.

FIG. 6 shows a circuit according to an embodiment of the present invention, in which the power-supply wiring PL is connected via the external terminal $V_{DD}$ to the output terminal of a power-supply unit not shown, and the ground wiring GL is connected to a ground point of the circuit via the external terminal $V_{SS}$.

An electronic circuit 4, a reference voltage generator VRG, a voltage comparator AB and a logic circuit 3 are connected between the power-supply wiring PL and the ground wiring GL, and are operated by the power-supply voltage applied between these wirings.

The electronic circuit 4 consists of the clock generators, decoders and the like shown in FIG. 1.

Although there is no particular limitation, the reference voltage generator circuit VRG consists of MOSFET's $Q_{31}$ to $Q_{36}$. Referring to the MOSFET's $Q_{31}$ to $Q_{34}$ connected in series between line PL and line GL, the gate is connected to the drain such that they will work as voltage dividing resistors. In other words, the MOSFET's $Q_{31}$ to $Q_{34}$ constitute a voltage divider. The MOSFET's $Q_{35}$ and $Q_{36}$ connected in series constitute an output circuit which converts the impedance. The reference voltage $V_{ref}$ produced by the reference voltage generator VRG can be suitably set if the values of the MOSFET's $Q_{31}$ to $Q_{34}$ connected in series are suitably set.

The voltage $V_{ref}$ produced by the reference voltage generator VRG is supplied to the voltage comparator AB via a reference voltage wiring RL.

The voltage comparator circuit AB constitutes an address buffer circuit as shown in FIG. 4. The voltage comparator AB discriminates the logic level of input signals fed to the external terminal S in comparison with the voltage $V_{ref}$ which serves as a logic threshold voltage. The output signal of the voltage comparator AB serves as an input signal to the logic circuit 3.

According to this embodiment, a capacitor $C_2$ of a relatively large capacitance is connected between the reference voltage wiring RL and the ground wiring GL, and a capacitor $C_1$ of a relatively large capacitance is also connected between the reference voltage wiring RL and the power-supply wiring PL. Further, since the reference voltage wiring RL elongates on the semiconductor substrate, there is inevitably formed a parasitic capacitor $C_{11}$ of a relatively small capacitance between the reference voltage wiring RL and the ground wiring GL. Similarly, a parasitic capacitor $C_{21}$ of a relatively small capacitance is also formed between the reference voltage wiring RL and the power-supply wiring PL.

The voltage dividing ratio determined by the capacitors $C_1$ and $C_2$ of FIG. 6 should be brought into agreement with the voltage dividing ratio of the reference voltage generator VRG, as will become obvious from the following description. In other words, the ratio of capacitance of the capacitors $C_1$ and $C_2$ should be brought into agreement with the inverse ratio of the power-supply voltage $V_{DD}$, supplied to the power-supply wiring PL to the reference voltage $V_{ref}$ that is to be obtained. However, since the reference voltage generator VRG usually has a small output impedance, the ratio of the capacitance of capacitors $C_1$ and $C_2$ does not necessarily need to be brought into agreement with a desired value.

According to this embodiment, provision of the capacitor $C_2$ reinforces the capacitive coupling between the reference voltage wiring RL and the ground wiring GL. Accordingly, the noise applied to the reference voltage wiring RL is reduced relatively greatly via the stray capacitance $C_\phi$ formed between the reference voltage wiring RL and a wiring (not shown) which is served with clock signals $\phi_i$ and via the stray capacity $C_a$ formed between the reference voltage wiring RL and a wiring (not shown) to which are supplied data signals $A_i$ and like signals.

When the potential at either one of the external terminals $V_{DD}$ or $V_{SS}$ is changed by random noise, the potential variation on the reference voltage wiring RL is limited to within a relatively small range due to the capacitor $C_1$ or $C_2$ connected between the reference voltage wiring RL and the wiring PL or GL that does not develop substantial variations in potential.

When noise is induced in the power-supply wiring PL and in the ground wiring GL due to the operation of the circuits AB, 3, 4, noise applied to the reference voltage wiring RL is reduced as described below.

Namely, transient current flows from the power-supply wiring PL to the circuits AB, 3, 4, and then into the ground wiring GL. Therefore, unlike the random noise, the noise or the potential variation induced on the power-supply wiring PL by the operation of the circuits AB, 3, 4, changes in synchronism with the noise or the potential variation induced on the ground wiring GL.

Figure 7:
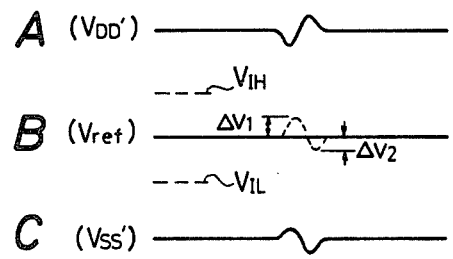
FIGS. 7A to 7C are diagrams of operation waveforms of the circuit of FIG. 6.

When the potential of the power-supply wiring PL is decreased from a predetermined value as shown in FIG. 7A due to the transient current, the potential of the ground wiring GL is increased by the same transient current as shown in FIG. 7C. Conversely, when the potential of the power-supply wiring PL is temporarily raised, the potential of the ground wiring GL is temporarily lowered correspondingly.

Accordingly, the noise applied from the ground wiring GL to the reference voltage wiring RL via the capacitor $C_2$ is cancelled by noise of the opposite phase applied from the power-supply wiring PL to the reference voltage wiring RL via the capacitor $C_1$. Consequently, the reference voltage $V_{ref}$ in the reference voltage wiring RL does not substantially vary, as indicated by a solid line in FIG. 7B, irrespective of noise induced on the wirings PL and GL.

When the capacitor $C_1$ is removed from the circuit of FIG. 6, the reference voltage $V_{ref}$ of the reference voltage wiring RL undergoes variation in response to noise induced on the ground wiring GL as indicated by a broken line in FIG. 7B. In this case, the voltage margin of the reference voltage $V_{ref}$ for the input signals $V_{IN}$ of the level "1" $V_{IH}$ and the level "0" $V_{IL}$ applied to the voltage comparator circuit AB, is reduced by amounts $\Delta v_1$ and $\Delta v_2$. Consequently, the operation margin of the voltage comparator circuit AB is reduced.

When the capacitor $C_1$ is provided as shown in FIG. 6, the reference voltage $V_{ref}$ formed in the IC is maintained substantially at a constant value, making it possible to prevent erroneous operation of the voltage comparator circuit AB which the input signals $V_{IN}$ from the external units via the external terminal S are applied to.

Further, the circuit shown in FIG. 6 may be modified. For example, the voltage-dividing circuit consisting of MOSFET's $Q_{31}$ to $Q_{34}$ in the reference voltage generator VRG may be made up of a combination of resistors such as semiconductor resistors, or a combination of resistors and diodes or diode-connected transistors or constant-voltage elements such as MISFET's. Further, the output circuit consisting of MOSFET's $Q_{35}$ and $Q_{36}$ may be replaced by a push-pull circuit, an emitter-follower circuit, or the like. Moreover, when the electronic circuit such as voltage comparator circuit which receives the voltage $V_{ref}$ has a very great input impedance, the output circuit which works as an impedance converting means may be eliminated. In a monolithic semiconductor integrated circuit including the reference voltage generator VRG, electronic circuit 4, and the like, the capacitors $C_1$ and $C_2$ are formed by a laminate structure consisting of an aluminum electrode—silicon oxide film—polycrystalline silicon or a semiconductor diffusion layer. The capacitors $C_1$ and $C_2$ can also be formed by positively crossing or overlapping both the power-supply wiring PL and the ground wiring GL on the reference voltage wiring RL.

Figure 8:
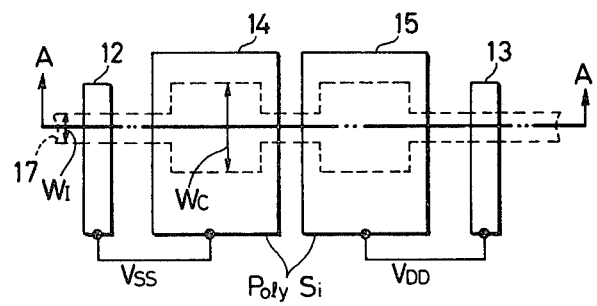
FIG. 8 is a diagram of the pattern for the wiring layer employed in a semiconductor integrated circuit device according to an embodiment of the present invention.
Figure 9:
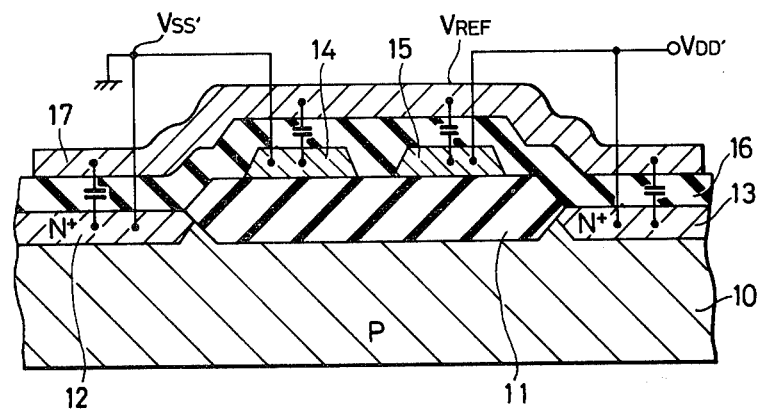
FIG. 9 is a sectional view taken along the line A—A of FIG. 8.

FIG. 8 shows a pattern of the capacitors $C_1$ and $C_2$ according to an embodiment of the present invention, and FIG. 9 is a section view of the semiconductor substrate taken along the line A—A' of FIG. 8.

In FIG. 9, reference numeral 10 denotes a semiconductor substrate consisting of p-type monocrystalline silicon, 11 denotes a field insulating film composed of $SiO_2$ having a relatively large thickness formed on the surface of the silicon substrate 10 except on the surfaces of the active regions, i.e., except the surfaces where the MOSFET's, semiconductor resistance regions and semiconductor ductor wiring regions are formed, 12 denotes an n-type semiconductor region that serves as the ground wiring, 13 deontes an n-type semiconductor region that serves as the wiring, 14 and 15 denote electrically conductive polycrystalline silicon layers that are formed on the insulating film 11, 16 denotes an insulating film composed of $SiO_2$ formed by a chemical vaporization method (CVD method), and 17 denotes an aluminum layer that serves as a reference voltage wiring RL.

In FIG. 8, the pattern of the aluminum layer 17 is indicated by a broken line, and patterns of the n-type semiconductor regions 12, 13, and polycrystalline silicon layers 14, 15 are indicated by solid lines.

The polycrystalline silicon layer 14 serves as one electrode of the capacitor $C_2$, and is electrically connected to the n-type semiconductor region 12 via coupling means such as an aluminum layer that is formed simultaneously with the formation of the aluminum layer 17. The polycrystalline layer 15 serves as one electrode of the capacitor $C_1$, and is electrically connected to the n-type semiconductor region 13 via some coupling means.

Portions of the aluminum layer 17 formed on the polycrystalline silicon layers 14 and 15 are used as wiring layers, and are also utilized as other electrodes of the capacitors $C_2$ and $C_1$. The portions of the aluminum layer 17 utilized as wiring layers have a relatively narrow width WI, and the portions utilized as the electrodes of the capacitors $C_2$, $C_1$ have a relatively large width WC, as shown in FIG. 8. Therefore, a large parasitic capacitance is formed between the aluminum layer 17 and the polycrystalline silicon layer 14 as compared with the parasitic capacitance that is formed when the aluminum layer 17 has a constant width WI. Similarly, a relatively large capacitance is formed between the aluminum layer 17 and the polycrystalline silicon layer 15.

Referring to the constructions shown in FIGS. 8 and 9, parasitic capacitances formed between the polycrystalline silicon layers 14, 15 and the semiconductor substrate 10 have relatively small values, since the polycrystalline silicon layers 14 and 15 have been formed on the semiconductor substrate 10 via a thick field insulating film 11. Consequently, even when the potential of the semiconductor substrate 10 is varied by ripple components in the back bias voltage, undesired potential variations fed from the semiconductor substrate 10 to the polycrystalline silicon layers 14 and 15 via parasitic capacitances are restricted to small values. Accordingly, potential variations induced on the aluminum layer 17 due to potential variations of the semiconductor substrate 10 are also restricted to small values.

Figure 10:
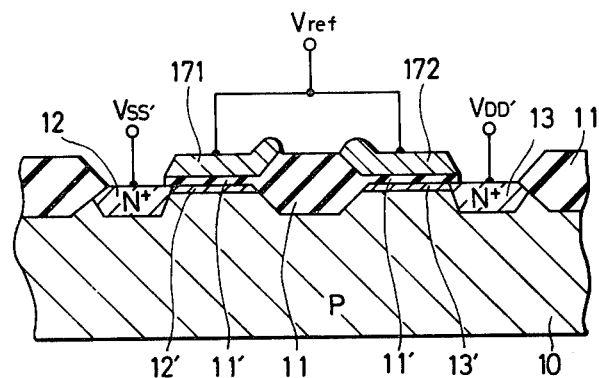
FIG. 10 is a sectional view of a semiconductor integrated circuit device according to another embodiment of the present invention.

FIG. 10 is a section view of a capacitor according to another embodiment.

In FIG. 10, one capacitor consists of an thin insulating film 11' formed on the surface of the p-type semiconductor substrate 10 adjacent to the n-type semiconductor region 12, an electrically conductive polycrystalline silicon layer 171 formed on the thin insulating film 11', and a channel layer 12' which will be induced on the surface of the semiconductor substrate 10 when the reference voltage $V_{ref}$ is applied to the polycrystalline silicon layer 171. The channel layer 12' is connected to the n-type semiconductor region 12 which is maintained at ground potential. Similarly, another capacitor consists of a polycrystalline silicon layer 172, the thin insulating film 11' and a channel layer 13'. Although not diagrammed, a MOSFET in which the gate electrode consists of a polycrystalline silicon layer, with the source region and the drain region formed by a self-aligning technique, is formed on the surface of the semiconductor substrate 10 of FIG. 10. By utilizing the techniques for producing integrated circuits, the insulating film 11' is formed simultaneously with the formation of gate insulating film of the MOSFET, and the polycrystalline silicon layers 171 and 712 are formed simultaneously with the formation of the gate electrode of the MOSFET. Further, the n-type semiconductor regions 12 and 13 are formed simultaneously with the formation of the drain and source regions of the MOSFET.

Thus, the construction shown in FIG. 10 can be formed without requiring any particular IC manufacturing steps.

Instead of the constructions shown in FIGS. 9 and 10, the capacitor may be so formed that the polycrystalline silicon layer formed on the field insulating film is connected to the reference voltage wiring, and an electrically conductive layer such as metallized aluminum layer formed on the polycrystalline silicon layer via an insulating film is connected to the power-supply wiring or to the ground wiring, or that the channel layer induced on the surface of the semiconductor substrate is coupled to the reference voltage wiring, and the electrically conductive layer formed on the channel layer via the insulating film is connected to the power-supply wiring or to the ground wiring. In these cases, however, attention should be paid that the coupling is reinforced between the reference voltage wiring and the semiconductor substrate. In these cases, if the potential of the semiconductor substrate undergoes changes due to ripple components in the back bias voltage, the reference voltage correspondingly undergoes relatively great changes.

In the cases of FIGS. 9 and 10, furthermore, the conductive layers 14, 15 and the channel layers 12', 13' further serve as shielding conductors. Consequently, reduced potential variation is given from the semiconductor substrate 10 to the reference voltage wiring.

Figure 11:
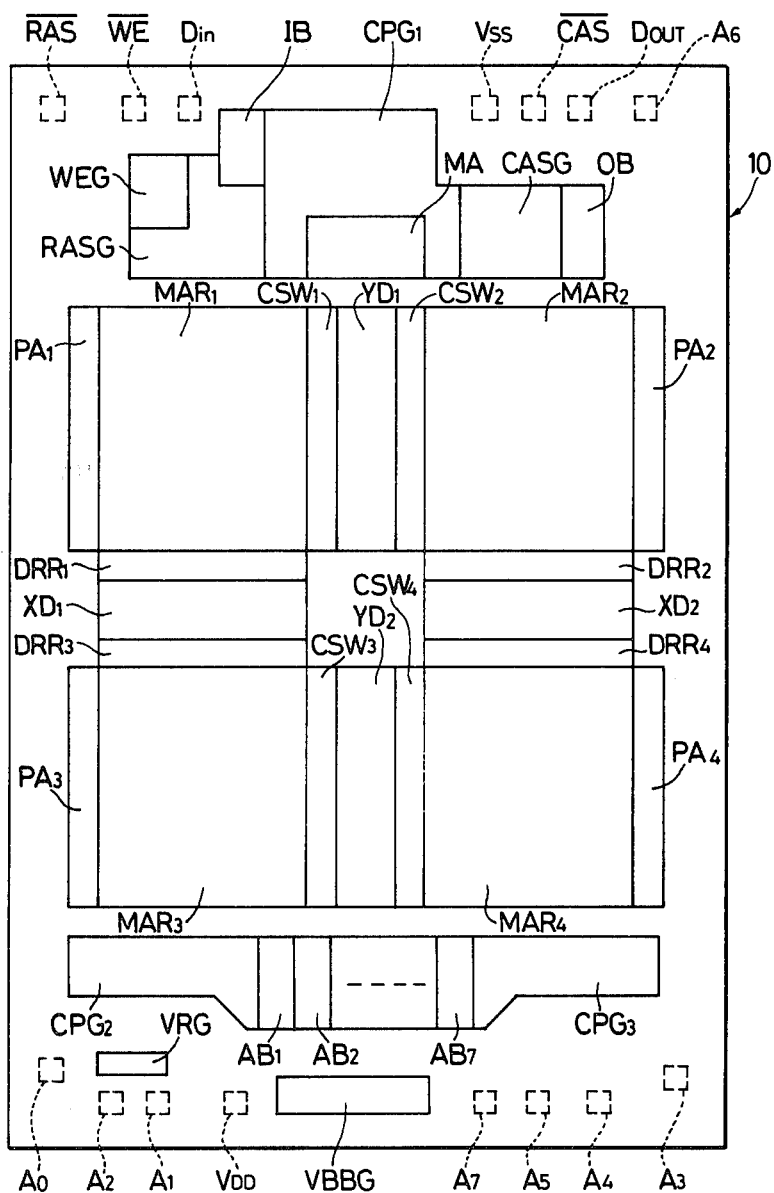
FIG. 11 is a diagram of the circuit block layout of a semiconductor integrated circuit device according to another embodiment.

FIG. 11 is a diagram of the circuit block layout of a semiconductor integrated circuit device according to another embodiment. In FIG. 11, the circuit blocks formed on the semiconductor substrate constitute, as a whole, a RAM shown in FIG. 1. Though postscripts are attached, the symbols of FIG. 11 correspond to those of FIG. 1. In FIG. 11, broken lines indicate bonding pads $\overline{RAS}$, $\overline{WE}$, etc. that are formed on the semiconductor substrate and that serve as external terminals.

Though there is no particular limitation, the memory array MAR of FIG. 1 is divided into four memory arrays $MAR_1$ to $MAR_4$ arrayed on the semiconductor substrate as shown in FIG. 11. Similarly, the circuit blocks of FIG. 1 are suitably divided and arrayed on the semiconductor substrate.

Figure 12:
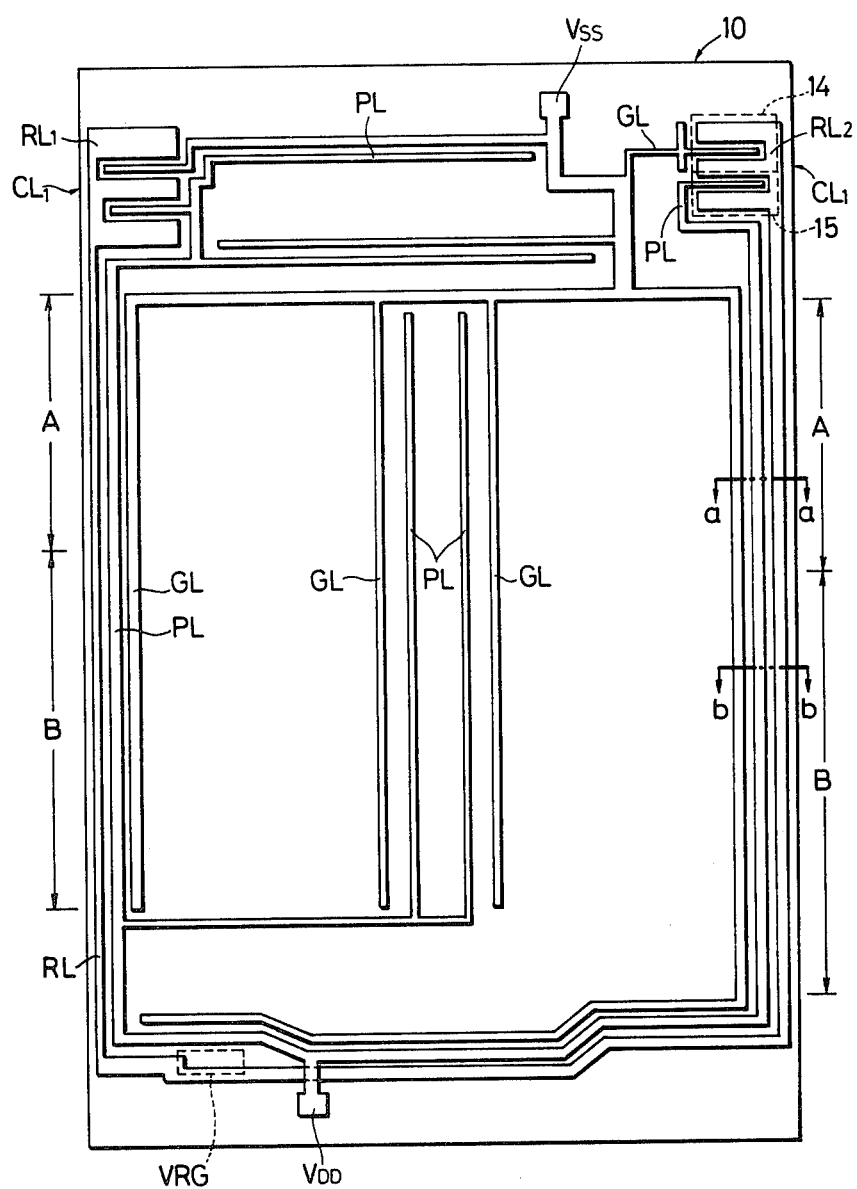
FIG. 12 is a diagram of the pattern for the wiring layer that will be superposed on the layout diagram of FIG. 11.

FIG. 12 shows patterns of the power-supply wiring PL, ground wiring GL and reference voltage wiring RL that are formed on the semiconductor substrate corresponding to the circuit layout of FIG. 11. A variety of signal wirings are formed on the semiconductor substrate simultaneously with the formation of wirings of FIG. 12. To make it easier to understand and to simplify the drawing, however, these signal wirings are not shown in FIG. 12.

The power-supply wiring PL is coupled to the bonding pad $V_{DD}$ which is served with the power-supply voltage. The power-supply wiring PL has a portion which spans the lateral direction in the lower portion of FIG. 12. The clock generators $CPG_2$, $CPG_3$, address buffers $AB_1$ to $AB_7$, reference voltge generator VRG, and back bias voltage generator VBBG of FIG. 11 are served with the power-supply voltage via the above-mentioned portion of the power-supply wiring PL. The power-supply wiring PL has portions that stretch along both sides of the semiconductor substrate and a portion that stretches through the center of the semiconductor substrate, supplying the power-supply voltage to the preamplifiers $PA_1$ to $PA_4$, and column decoders $YD_1$, $YD_2$. The power-supply wiring PL further has a portion that stretches in the lateral direction in the upper portion of FIG. 12 to supply the power-supply voltage to the circuits WEG, RASG, and the like of FIG. 11.

The ground wiring GL is coupled to the bonding pad $V_{SS}$ that is maintained at ground potential. The ground wiring GL is symmetrical with respect to the power-supply wiring PL, and spans the semiconductor substrate.

In the RAM shown in FIGS. 11 and 12, although there is no particular limitation, the reference voltage $V_{ref}$ generated by the reference voltage generator VRG is supplied to the address buffer circuits $AB_1$ to $AB_7$, and to the data input buffer circuit IB via the reference voltage wiring RL.

The reference voltage wiring RL runs along the outermost periphery of the semiconductor substrate 10 as shown in FIG. 12, so that noise will not be introduced from the signal wirings except the power-supply wiring PL and the ground wiring GL.

According to this embodiment, the reference voltage wiring RL formed in the sections A and B of FIG. 12 constitutes the electrodes of the capacitors.

Figure 13:
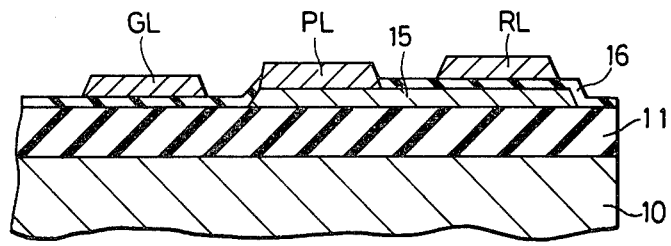
FIGS. 13 and 14 are sectional views taken along lines a—a and b—b, respectively, of FIG. 12.
Figure 14:
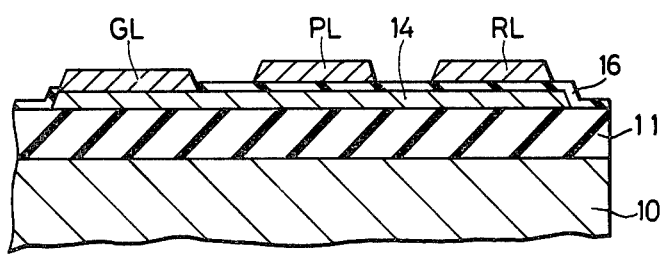

FIG. 13 is a section view taken along line a—a in section A of FIG. 12, and FIG. 14 is a section view taken along line a—a in section B of FIG. 12.

In FIGS. 13 and 14, electrically conductive polycrystalline silicon layers 15 and 14 that serve as conductive layers are formed on the surface of the field insulating film 11 beneath the reference voltage wiring RL, the polycrystalline silicon layers 15, 14 being formed simultaneously with the formation of gate electrode of the silicon gate MOSFET formed on the semiconductor substrate 10. The reference voltage wiring RL stretches on the polycrystalline silicon layers 15, 14 via a $SiO_2$ insulating film 16 formed by the CVD (chemical vapor deposition) method.

The polycrystalline silicon layer 15 is connected to the power-supply wiring PL as shown in FIG. 13, and the polycrystalline silicon layer 14 is connected to the ground wiring GL as shown in FIG. 14.

Therefore, in section A of FIG. 12, the reference voltage wiring RL is electrically coupled to the power-supply wiring PL via a capacitor which consists of the reference voltage wiring RL, insulating film 16 and polycrystalline silicon layer 15. In the section B of FIG. 12, the reference voltage wiring RL is electrically coupled to the ground wiring GL via a capacitor which consists of the reference voltage wiring RL, insulating film 16 and polycrystalline silicon layer 14.

According to this embodiment, the portion of the semiconductor substrate 10 where no circuit block is formed is effectively utilized for forming the capacitor. As shown in FIG. 12, furthermore, portions $RL_1$ and $RL_2$ of the reference voltage wiring RL have increased widths in a portion $CL_1$ where no circuit block is formed. In the surface portion $CL_1$, polycrystalline silicon layers 14', 15' are formed to constitute capacitors like the polycrystalline silicon layers shown in FIGS. 13 and 14. The polycrystalline silicon layer 14' is connected to the ground wiring GL, and the polycrystalline silicon layer 15' is connected to the power-supply wiring PL.

Therefore, the capacitor $C_1$ shown in FIG. 6 is established by a capacitance formed in section A and a capacitance formed in the surface portion $CL_1$, and the capacitor $C_2$ is established by a capacitance formed in the section B and a capacitance formed in the surface portion $CL_1$.

According to the embodiment shown in FIGS. 11 and 12, empty space in the surface of the semiconductor substrate is effectively utilized, and the reference voltage wiring RL is effectively utilized as an electrode of the capacitor. Hence, capacitors $C_1$, $C_2$ having relatively large capacitances are formed without any need to increase the area of the semiconductor substrate 10. In the construction shown in FIGS. 12 to 14, the electrically conductive layers 15 and 14 are formed on the field insulating film 11 and serve as shielding conductors as in the construction of FIG. 9. Consequently, undesirable electric coupling between the reference voltage wiring RL and the semiconductor substrate 10 is weakened.

What is claimed is:

1. A semiconductor integrated circuit device comprising:
    a pair of first and second wirings to which a power-supply voltage is applied;
    an electronic circuit connected between said first wiring and said second wiring, and to which said power-supply voltage is applied via said first and second wirings;
    a third wiring to which a reference voltage is applied;
    a reference voltage generator to which said power-supply voltage is applied via said first and second wirings, said reference voltage generator including means for producing said reference voltage;
    a first capacitor for a-c coupling said third wiring to said second wiring; and
    a second capacitor for transmitting variations in potential produced on said first wiring to said third wiring;
    wherein when first and second potential variations substantially equal in magnitude and opposite in phase have developed respectively on said first and second wirings due to changes in the operation current of said electronic circuit, the potential variation supplied to said third wiring via said first capacitor is substantially cancelled by the potential variation supplied to said third wiring via said second capacitor.

2. A semiconductor integrated circuit device according to claim 1, wherein said electronic circuit is comprised of a clock signal generator to which said power-supply voltage is applied via said first and second wirings.

3. A semiconductor integrated circuit device according to claim 2, wherein said first and second capacitors are each composed of a first electrically conductive layer formed on the semiconductor substrate and electrically insulated therefrom via a first insulating film, and a second electrically conductive layer formed on said first electrically conductive layer and electrically insulated therefrom via a second insulating layer.

4. A semiconductor integrated circuit device according to claim 3, wherein the second conductive layers of said first and second capacitors are connected to the third wiring, the first conductive layer of said first capacitor is connected to said first wiring, and the first conductive layer of said second capacitor is connected to said second wiring.

5. A semiconductor integrated circuit device according to claim 3, wherein the second conductive layers of said first and second capacitors are composed of the third wiring, the first conductive layer of said first capacitor is connected to said first wiring, and the first conductive layer of said second capacitor is connected to said second wiring.

6. A semiconductor integrated circuit device comprising:
    a semiconductor substrate;
    a pair of first and second wiring layers that are formed on said semiconductor substrate and to which a power-supply voltage is applied;
    an electronic circuit connected between said first wiring layer and said second wiring layer, and to which said power-supply voltage is applied via said first and second wiring layers;
    a reference voltage generator which contains a plurality of resistance elements and which produces a reference voltage upon receipt of the power-supply voltage via said first and second wiring layers;

a third wiring layer formed on said semiconductor substrate and to which said reference voltage is applied;

an input circuit which is comprised of a plurality of insulated gate field effect transistors, and which has a first input terminal that receives input signals from the outside of said semiconductor substrate, and a second input terminal to which said reference voltage is applied via said third wiring layer;

a first capacitor connected between said first wiring layer and said third wiring layer; and a second capacitor connected between said second wiring layer and said third wiring layer, wherein when first and second potential variations substantially equal in magnitude and opposite in phase have developed respectively on said first and second wiring layers due to changes in the operation current of said electronic circuit, the potential variation supplied to said third wiring layers via said first capacitor is substantially cancelled by the potential variation supplied to said third wiring layers via said second capacitor.

7. A semiconductor integrated circuit device according to claim 6, wherein said third wiring layer is formed on the first and second conductive layers and electrically insulated therefrom via an insulating film, said first and second conductive layers being formed on said semiconductor substrate and electrically insulated therefrom via an insulating film, and wherein said first capacitor is comprised of said first conductive layer and said third wiring layer, and said second capacitor is comprised of said second conductive layer and said third wiring layer.

8. A semiconductor integrated circuit device according to claim 7, wherein said first and second conductive layers each are comprised of an electrically conductive layer divided into a plurality of sections.

9. A semiconductor integrated circuit device according to claim 7, wherein a major portion of said third wiring layer is arrayed on the outer side of said first and second wiring layers on said semiconductor substrate.

10. A semiconductor integrated circuit device according to claim 7, wherein said first and second conductive layers are formed simultaneously with the formation of the gate electrodes of said insulated gate field effect transistors.

11. A semiconductor integrated circuit device according to claim 10, wherein said first to third wiring layers are composed of a metal, and said first and second conductive layers are composed of polycrystalline silicon.

12. A semiconductor integrated circuit device according to claim 6, wherein said electronic circuit comprises a clock signal generator which is comprised of insulated gate field effect transistors, and to which said power-supply voltage is applied via said first and second wiring layers, and said input circuit is controlled by the clock signals produced by said clock signal generator.

13. A semiconductor integrated circuit device according to claim 6, wherein said electronic circuit is comprised of a back bias voltage generator comprising insulated gate field effect transistors, and which produces a bias voltage that will be applied to said semicondcutor substrate upon receipt of the power-supply voltage via said first and second wiring layers.

14. A semiconductor integrated circuit device according to claim 6, wherein said first and second capacitors are composed of MOS capacitors that are formed simultaneously with the formation of said insulated gate field effect transistors.

* * * * *